(12) United States Patent
Philippart et al.

(10) Patent No.: US 9,329,219 B2
(45) Date of Patent: May 3, 2016

(54) SYSTEM AND METHOD OF USING FLEXIBLE ECU INPUTS TO SPECIFICALLY DETERMINE THE TYPE OF ELECTRICAL FAULT ON AN INPUT

(71) Applicant: GM Global Technology Operations LLC, Detroit, MI (US)

(72) Inventors: Timothy P. Philippart, Orion, MI (US); Steven Zechiel, Canton, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 144 days.

(21) Appl. No.: 13/943,118

(22) Filed: Jul. 16, 2013

(65) Prior Publication Data

US 2015/0022215 A1   Jan. 22, 2015

(51) Int. Cl.
| | |
|---|---|
| *G01R 31/00* | (2006.01) |
| *B60L 3/00* | (2006.01) |
| *B60L 3/04* | (2006.01) |
| *G01R 19/165* | (2006.01) |

(52) U.S. Cl.
CPC ............. *G01R 31/007* (2013.01); *B60L 3/0069* (2013.01); *B60L 3/04* (2013.01); *G01R 19/16595* (2013.01); *B60L 2240/36* (2013.01)

(58) Field of Classification Search
None
See application file for complete search history.

(56) References Cited

U.S. PATENT DOCUMENTS

| | | | | |
|---|---|---|---|---|
| 5,854,569 | A  * | 12/1998 | Kohno et al. | 327/543 |
| 7,085,335 | B2 * | 8/2006 | Rawlins et al. | 375/346 |
| 2004/0041607 | A1* | 3/2004 | Pan | 327/170 |
| 2006/0208934 | A1* | 9/2006 | Matsushima | 341/120 |
| 2008/0074117 | A1* | 3/2008 | Kamel et al. | 324/503 |
| 2008/0191783 | A1* | 8/2008 | Sudjian et al. | 327/536 |
| 2011/0121754 | A1* | 5/2011 | Shteynberg et al. | 315/294 |
| 2012/0068546 | A1* | 3/2012 | Kuramochi et al. | 307/80 |

* cited by examiner

*Primary Examiner* — John R Olszewski
*Assistant Examiner* — Nicholas K Wiltey

(57) ABSTRACT

A control module includes an input module configured to operate in a normal operating state and a fault diagnosis state. The input module receives an input signal from a circuit module and generates a voltage based on the input signal. In the normal operating state, a fault diagnostic module determines whether the voltage is in a first range or a second range. The first range and the second range indicate that a fault is detected in the circuit module. The fault diagnostic module determines that the detected fault is a first fault type if the voltage is in the first range, transitions the input module from the normal operating state to the fault diagnosis state if the voltage is in the second range, and determines whether the detected fault is a second fault type or a third fault type based on the voltage in the fault diagnosis state.

12 Claims, 5 Drawing Sheets

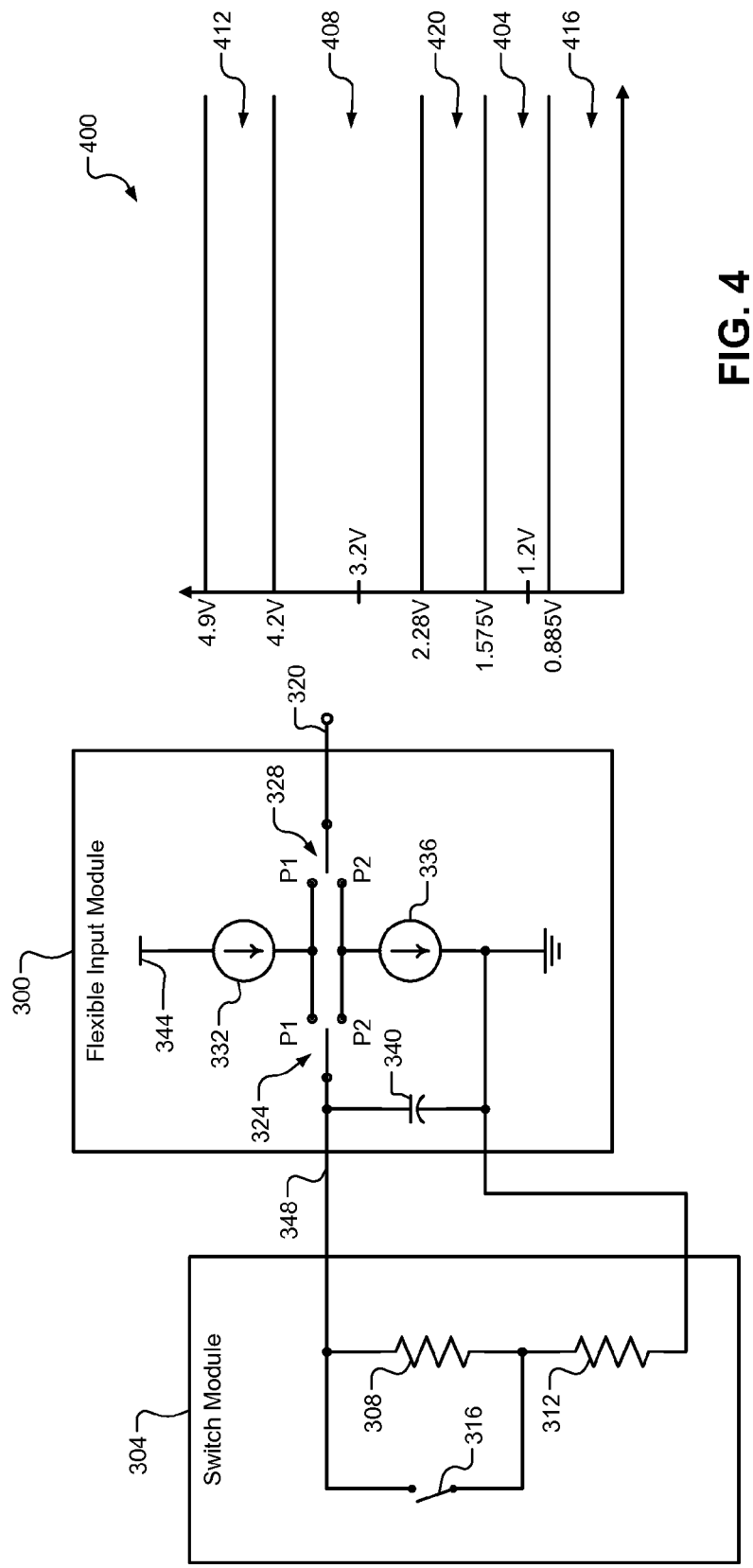

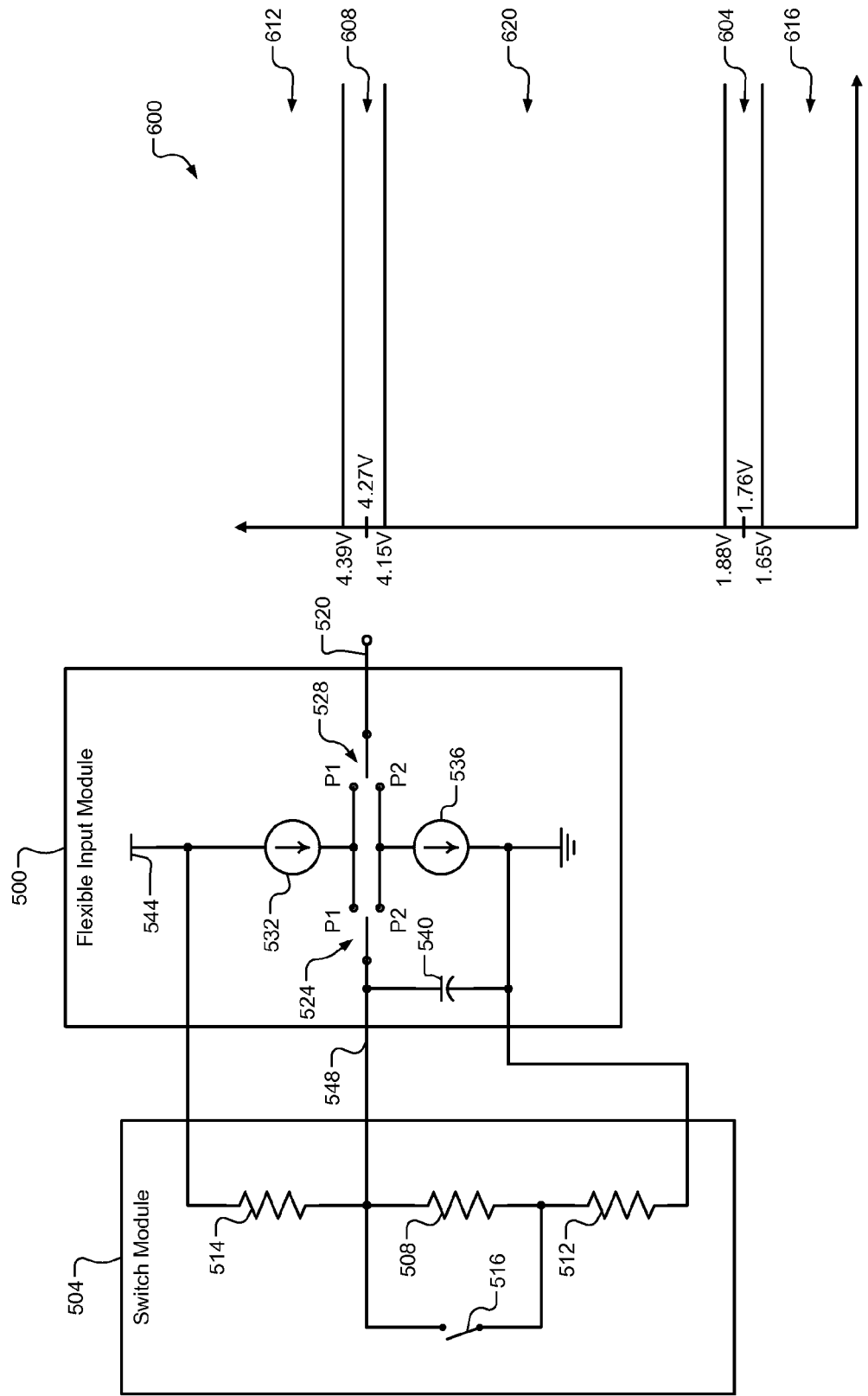

SYSTEM AND METHOD OF USING FLEXIBLE ECU INPUTS TO SPECIFICALLY DETERMINE THE TYPE OF ELECTRICAL FAULT ON AN INPUT

FIELD

The present disclosure relates to detection and diagnoses of vehicle electrical faults.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Vehicle electronic control systems, such as engine control systems and transmission control systems, use electrical and electro-mechanical devices (e.g., circuits) to monitor operating conditions and to adjust operation. The vehicle control systems may include diagnostic systems that determine whether the devices (e.g., devices generating input signals and output devices) are functioning as designed. Demands on the diagnostic systems have increased as the vehicle control systems have become more complex. A requirement of vehicle diagnostic systems may be quick and accurate detection faults, including both continuous and intermittent faults, in order to maintain reliable operation of the control system.

Functional performance requirements of a vehicle control system or a particular subsystem and its components may vary. For example, the diagnostic system may be required to detect and respond to an electrical fault of a first device or first input signal in less than 50 milliseconds to maintain and stabilize operation of the control system. Other input signals or output devices may allow diagnosis and response over longer or shorter intervals.

SUMMARY

A control module includes an input module and a fault diagnostic module. The input module is configured to operate in a normal operating state and a fault diagnosis state. The input module receives an input signal from a circuit module and generates a voltage based on the input signal. The fault diagnostic module determines whether the voltage is in a first range or a second range while the input module is in the normal operating state. The first range and the second range indicate that a fault is detected in the circuit module. The fault diagnostic module determines that the detected fault is a first fault type if the voltage is in the first range, transitions the input module from the normal operating state to the fault diagnosis state if the voltage is in the second range, and determines whether the detected fault is a second fault type or a third fault type based on the voltage while the input module is in the fault diagnosis state.

A method includes receiving, at an input module configured to operate in a normal operating state and a fault diagnosis state, an input signal from a circuit module, generating a voltage based on the input signal, determining whether the voltage is in a first range or a second range while the input module is in the normal operating state, wherein the first range and the second range indicate that a fault is detected in the circuit module, determining that the detected fault is a first fault type if the voltage is in the first range, transitioning the input module from the normal operating state to the fault diagnosis state if the voltage is in the second range, and determining whether the detected fault is a second fault type or a third fault type based on the voltage while the input module is in the fault diagnosis state Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 illustrates a first example configuration of a switch module and a flexible input module according to the present disclosure;

FIG. 4 is a first example analog voltage input graph according to the present disclosure;

FIG. 5 illustrates a first example configuration of a switch module and a flexible input module according to the present disclosure;

FIG. 6 is a second example analog voltage input graph according to the present disclosure.

In the drawings, reference numbers may be reused to identify similar and/or identical elements.

DETAILED DESCRIPTION

A controller/control module of a vehicle electronic control system includes multiple pins for outputting and receiving signals. One or more of the pins may monitor various signals corresponding to electronic circuits and/or individual electronic components (e.g., switches, sensors, thermistors, etc.) in the electronic control system. In particular, the one or more pins may monitor the signals corresponding to the electronic circuits to diagnose faults in the electronic circuits. For example only, the faults may include, but are not limited to, an open circuit and/or a short circuit.

In the vehicle electronic control system according to the present disclosure, diagnostic systems and methods implement flexible inputs (e.g., in the control module) to receive the signals from one or more of the electronic circuits. The signals may include analog (i.e., continuous value) signals, time based (e.g., discrete, duty cycle, frequency) signals, or another suitable type of signal. For example only, the flexible inputs include configurable (e.g., software or hardware configurable) current sources and diagnose faults in the electronic circuits based on the signals. Elements of the flexible inputs (e.g., the current sources) are dynamically adjusted during operation to determine a type of a detected fault. For example, a current source in a flexible input that detects a fault may be adjusted to determine whether the detected fault is an open circuit, a short circuit, or another type of fault. For example only, a topology of the current source may be changed from a pull-up current source to a pull-down current source and/or a current through the current source may be limited/adjusted. The control module monitors the flexible input to determine the type of the detected fault after the current source is adjusted.

For purposes of illustration, the present disclosure will be described in the context of an example vehicle control system for an internal combustion engine. However, the present disclosure is also applicable to other types of control systems.

Figure 1:
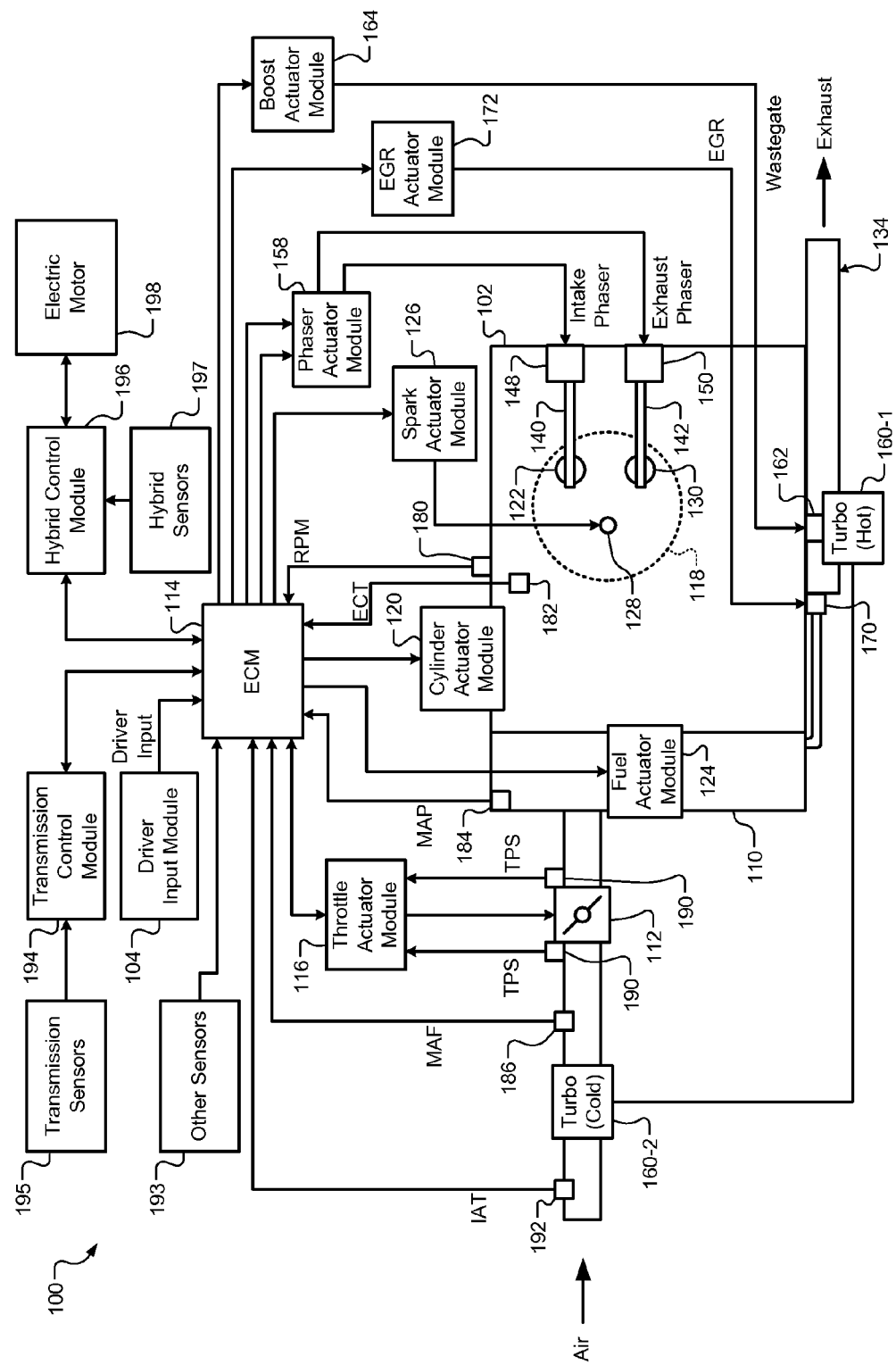
FIG. 1 is a functional block diagram of an example vehicle control system according to the present disclosure.

Referring now to FIG. 1, a functional block diagram of an example engine system 100 is presented. The engine system 100 includes an engine 102 that combusts an air/fuel mixture to produce drive torque for a vehicle based on driver input from a driver input module 104. Air is drawn into an intake manifold 110 through a throttle valve 112. For example only, the throttle valve 112 may include a butterfly valve having a rotatable blade. An engine control module (ECM) 114 controls a throttle actuator module 116, and the throttle actuator module 116 regulates opening of the throttle valve 112 to control airflow into the intake manifold 110.

Air from the intake manifold 110 is drawn into cylinders of the engine 102. While the engine 102 may include multiple cylinders, for illustration purposes a single representative cylinder 118 is shown. For example only, the engine 102 may include 2, 3, 4, 5, 6, 8, 10, and/or 12 cylinders. The ECM 114 may instruct a cylinder actuator module 120 to selectively deactivate some of the cylinders, which may improve fuel economy under certain engine operating conditions.

The engine 102 may operate using a four-stroke cycle. The four strokes, described below, are named the intake stroke, the compression stroke, the combustion stroke, and the exhaust stroke. During each revolution of a crankshaft (not shown), two of the four strokes occur within the cylinder 118. Therefore, two crankshaft revolutions are necessary for the cylinder 118 to experience all four of the strokes.

During the intake stroke, air from the intake manifold 110 is drawn into the cylinder 118 through an intake valve 122. The ECM 114 controls a fuel actuator module 124, which regulates fuel injection to achieve a desired air/fuel ratio. Fuel may be injected into the intake manifold 110 at a central location or at multiple locations, such as near the intake valve 122 of each of the cylinders. In various implementations (not shown), fuel may be injected directly into the cylinders or into mixing chambers associated with the cylinders. The fuel actuator module 124 may halt injection of fuel to cylinders that are deactivated.

The injected fuel mixes with air and creates an air/fuel mixture in the cylinder 118. During the compression stroke, a piston (not shown) within the cylinder 118 compresses the air/fuel mixture. Based on a signal from the ECM 114, a spark actuator module 126 energizes a spark plug 128 in the cylinder 118, which ignites the air/fuel mixture. The timing of the spark may be specified relative to the time when the piston is at its topmost position, referred to as top dead center (TDC).

The spark actuator module 126 may be controlled by a timing signal specifying how far before or after TDC to generate the spark. Because piston position is directly related to crankshaft rotation, operation of the spark actuator module 126 may be synchronized with crankshaft angle. In various implementations, the spark actuator module 126 may halt provision of spark to deactivated cylinders. Generating the spark may be referred to as a firing event. The spark actuator module 126 may have the ability to vary the timing of the spark for each firing event.

During the combustion stroke, the combustion of the air/fuel mixture drives the piston down, thereby driving the crankshaft. The combustion stroke may be defined as the time between the piston reaching TDC and the time at which the piston returns to bottom dead center (BDC). During the exhaust stroke, the piston begins moving up from BDC and expels the byproducts of combustion through an exhaust valve 130. The byproducts of combustion are exhausted from the vehicle via an exhaust system 134.

The intake valve 122 may be controlled by an intake camshaft 140, while the exhaust valve 130 may be controlled by an exhaust camshaft 142. In various implementations, multiple intake camshafts (including the intake camshaft 140) may control multiple intake valves (including the intake valve 122) for the cylinder 118 and/or may control the intake valves (including the intake valve 122) of multiple banks of cylinders (including the cylinder 118). Similarly, multiple exhaust camshafts (including the exhaust camshaft 142) may control multiple exhaust valves for the cylinder 118 and/or may control exhaust valves (including the exhaust valve 130) for multiple banks of cylinders (including the cylinder 118).

The cylinder actuator module 120 may deactivate the cylinder 118 by disabling opening of the intake valve 122 and/or the exhaust valve 130. In various other implementations, the intake valve 122 and/or the exhaust valve 130 may be controlled by devices other than camshafts, such as electromagnetic valve actuators, electro-hydraulic actuators, or another suitable type of valve actuator.

The time at which the intake valve 122 is opened may be varied with respect to piston TDC by an intake cam phaser 148. The time at which the exhaust valve 130 is opened may be varied with respect to piston TDC by an exhaust cam phaser 150. A phaser actuator module 158 may control the intake cam phaser 148 and the exhaust cam phaser 150 based on signals from the ECM 114. When implemented, variable valve actuation may also be controlled by the phaser actuator module 158.

The engine system 100 may include a boost device that provides pressurized air to the intake manifold 110. For example, FIG. 1 shows a turbocharger including a hot turbine 160-1 that is powered by hot exhaust gases flowing through the exhaust system 134. The turbocharger also includes a cold air compressor 160-2 that is driven by the turbine 160-1 and that compresses air leading into the throttle valve 112. In various implementations, a supercharger (not shown), driven by the crankshaft, may compress air from the throttle valve 112 and deliver the compressed air to the intake manifold 110.

A wastegate 162 may allow exhaust to bypass the turbine 160-1, thereby reducing the boost (the amount of intake air compression) of the turbocharger. The ECM 114 may control the turbocharger via a boost actuator module 164. The boost actuator module 164 may modulate the boost of the turbocharger by controlling the position of the wastegate 162. In various implementations, multiple turbochargers may be controlled by the boost actuator module 164. The turbocharger may have variable geometry, which may be controlled by the boost actuator module 164.

An intercooler (not shown) may dissipate some of the heat contained in the compressed air charge, which is generated as the air is compressed. The compressed air charge may also have absorbed heat from components of the exhaust system 134. Although shown separated for purposes of illustration, the turbine 160-1 and the compressor 160-2 may be attached to each other, placing intake air in close proximity to hot exhaust.

The engine system 100 may include an exhaust gas recirculation (EGR) valve 170, which selectively redirects exhaust gas back to the intake manifold 110. The EGR valve 170 may be located upstream of the turbocharger's turbine 160-1. The EGR valve 170 may be controlled by an EGR actuator module 172.

The engine system 100 may measure the speed of the crankshaft in revolutions per minute (RPM) using an RPM sensor 180. The temperature of the engine coolant may be measured using an engine coolant temperature (ECT) sensor 182. The ECT sensor 182 may be located within the engine 102 or at other locations where the coolant is circulated, such as a radiator (not shown).

The pressure within the intake manifold 110 may be measured using a manifold absolute pressure (MAP) sensor 184. In various implementations, engine vacuum, which is the difference between ambient air pressure and the pressure within the intake manifold 110, may be measured. The mass flow rate of air flowing into the intake manifold 110 may be measured using a mass air flow (MAF) sensor 186. In various implementations, the MAF sensor 186 may be located in a housing that also includes the throttle valve 112.

The throttle actuator module 116 may monitor the position of the throttle valve 112 using one or more throttle position sensors (TPS) 190. The ambient temperature of air being drawn into the engine 102 may be measured using an intake air temperature (IAT) sensor 192. One or more other sensors 193 may also be implemented. The ECM 114 may use signals from sensors to make control decisions for the engine system 100.

The ECM 114 may communicate with a transmission control module 194, for example, to coordinate gear shifts within a transmission (not shown). For example, the ECM 114 may reduce engine torque during a gear shift. The transmission control module 194 may receive signals from one or more sensors 195, such as one or more speed sensors, one or more pressure sensors, one or more torque sensors, one or more temperature sensors, and/or one or more transmission related sensors.

The ECM 114 may communicate with a hybrid control module 196, for example, to coordinate operation of the engine 102 and an electric motor 198. The hybrid control module 196 may receive signals from one or more sensors 197, such as one or more speed sensors, one or more pressure sensors, one or more torque sensors, one or more temperature sensors, one or more voltage sensors, one or more current sensors, and/or one or more other hybrid related sensors. The electric motor 198 may also function as a generator, and may be used to produce electrical energy for use by vehicle electrical systems and/or for storage in a battery. In various implementations, various functions of the ECM 114, the transmission control module 194, and the hybrid control module 196 may be integrated into one or more modules.

Each system that varies an engine parameter may be referred to as an actuator. Each actuator receives an actuator value. For example, the throttle actuator module 116 may be referred to as an actuator, and the throttle opening area may be referred to as the actuator value. In the example of FIG. 1, the throttle actuator module 116 achieves the throttle opening area by adjusting an angle of the blade of the throttle valve 112.

Similarly, the spark actuator module 126 may be referred to as an actuator, while the corresponding actuator value may be the spark timing. Other actuators may include the cylinder actuator module 120, the fuel actuator module 124, the phaser actuator module 158, the boost actuator module 164, and the EGR actuator module 172. For these actuators, the actuator values may correspond to number of activated cylinders, fueling rate, intake and exhaust cam phaser angles, boost pressure, and EGR valve opening area, respectively. The ECM 114 may control the actuator values in order to cause the engine 102 to generate a desired engine output torque.

The ECM 114 (and/or other control modules of the engine system 100 such as the transmission control module 194) according to the present disclosure implements configurable fault detection flexible inputs. For example only, the flexible inputs of the ECM 114 may communicate with resistive switch interfaces of electronic switches or other electrical components of various circuits of the engine system 100 to determine types of faults detected in the circuits.

Figure 2:
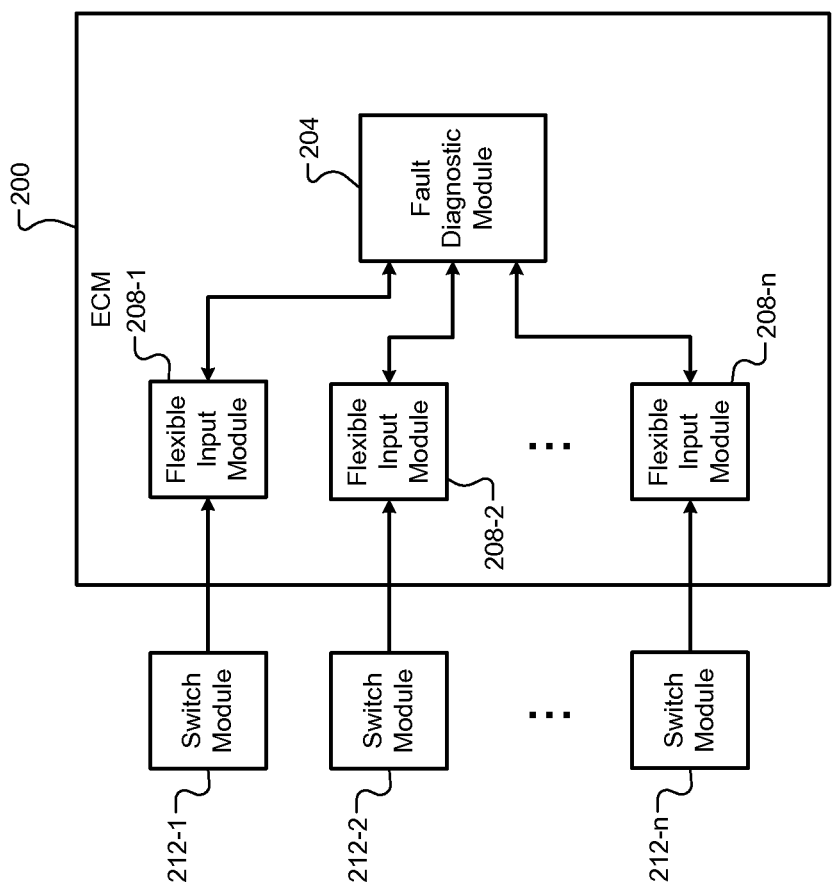
FIG. 2 is a functional block diagram of an example control module of a vehicle control system according to the present disclosure.

Referring now to FIG. 2, an example ECM 200 includes a fault diagnostic module 204 and a plurality of flexible input modules 208-1, 208-2, . . . , 208-n, referred to collectively as flexible input modules 208. Inputs corresponding to the input modules 208 may include analog or digital signals. For example, an analog input signal may include a continuous voltage or current. Conversely, a digital input signal may be time based (e.g., corresponding to a duty cycle or a frequency).

The flexible input modules 208 communicate with respective circuit modules, such as, for example only, switch modules 212-1, 212-2, . . . , and 212-n, referred to collectively as switch modules 212. Each of the input modules 208 monitor a voltage signal corresponding to an input received from the respective switch modules 212. The voltage signal may be within a first voltage range when a switch corresponding to the switch module 212 is open and within a second voltage range when the switch is closed. However, when the switch module 212 has an electrical fault such as an open circuit, a short to voltage, or a short to ground, the voltage signal may be within one or more voltage "dead bands" (e.g., a high dead band and a low dead band). The dead bands may be in voltage ranges that do not correspond to the switch being open or closed.

For example, in some configurations, the voltage signal being within the high dead band indicates an open circuit or a short to voltage and the voltage signal being within the low dead band indicates a short to ground. In other configurations, the voltage signal being within the high dead band indicates a short to voltage and the voltage signal being within the low dead band indicates an open circuit or a short to ground. Accordingly, in either configuration, the voltage signal may be in a voltage dead band that indicates at least two possible fault conditions.

The fault diagnostic module 204 transitions the input modules 208 between a normal operating state and a fault diagnosis state in response to the voltage signal being within one of the voltage dead bands. The fault diagnostic module 204 determines a type of the fault based on the behavior of the voltage signal upon transitioning from the normal operating state to the fault diagnosis state.

Referring now to FIG. 3, a flexible input module 300 and switch module 304 are shown in a first example configuration. For example only, the switch module 304 corresponds to an electronic transmission range selection (ETRS) park interface switch module. The switch module 304 includes a first resistor 308 and a second resistor 312 connected in series. A switch 316 is connected in parallel with the first resistor 308. When the switch 316 is open, a resistance of the switch module 304 corresponds to a combined resistance of the resistors 308 and 312. Conversely, when the switch 316 is closed, the first resistor 308 is bypassed and the resistance of the switch module 304 corresponds to a resistance of the second resistor 312. Accordingly, a voltage measured at an analog voltage input 320 of the input module 300 (e.g., corresponding to the voltage signal as described in FIG. 2) indicates whether the switch 316 is open or closed.

The input module 300 includes first and second switches 324 and 328, first and second current sources 332 and 336, and an optional capacitor 340. A supply voltage 344 (e.g., 5V) is provided to the first current source 332, and the second current source 336 is connected to ground. As shown, the first current source 332 and the second current source 336 are shown in a pull-up configuration. Although the pull-up configuration is shown, the first current source 332 and the second current source 336 may be arranged in a pull-down configuration. For example only, a current through the first current source 332 is approximately 0.75 mA to 1.25 mA. The first current source 332 and the second current source 336 may be adjustable.

During normal operation, the first and second switches 324 and 328 are in a first position P1 ("up," as shown), connecting the analog voltage input 320 to the first current source 332 and an input 348 of the switch module 304. The fault diagnostic module 204 monitors the analog voltage input 320 during normal operation to determine whether the switch 316 is open or closed, and to determine whether a fault condition exists in the switch module 304.

For example, as shown in an analog voltage input graph 400 in FIG. 4, the analog voltage input 320 may be in a first range 404 (for example only, optimally 1.2V, or between 0.855.V and 1.575V) when the switch 316 is closed. The analog voltage input 320 may be in a second range 408 (for example only, optimally 3.2V, or between 2.28V and 4.2V) when the switch 316 is open. For the pull-up configuration shown in FIG. 3, the analog voltage input 320 may be in a third range 412 (for example only, between 4.2V and 4.9V) corresponding to a high dead band range when a fault condition such as an open circuit or a short to voltage is present in the switch module 304. Conversely, the analog voltage input 320 may be in a fourth range 416 (for example only, between 0 and 0.855V) corresponding to a low dead band range when a fault condition such as a short to ground is present in the switch module 304. A fifth range 420 may correspond to an invalid switch state. Those skilled in the art can appreciate that the specific values shown in FIG. 4 are presented for example only, and my vary based on resistances of the resistors 308 and 312, resistances of the current sources 332 and 336, manufacturing tolerances, etc.

Accordingly, for the pull-up configuration shown in FIG. 3, the analog voltage input 320 being in the fourth range 412 may indicate either one of an open circuit fault or a short to voltage fault. In response to the analog voltage input 320 being in the fourth range 412, the fault diagnostic module 204 transitions the switches 324 and 328 to a second position P2 ("down," as shown), connecting the analog voltage input 320 to the second current source 336 and the input 348 of the switch module 304, corresponding to a fault diagnosis state.

In response to the transition to the fault diagnosis state, the analog voltage input 320 indicates whether the detected fault is an open circuit fault or a short to voltage fault. For example, if the detected fault is an open circuit fault, the analog voltage input 320 changes to the fourth range 416 since the input 348 is disconnected from the supply voltage 344. Conversely, if the detected fault is a short to voltage fault, the analog voltage input 320 will be greater than the fourth range 416. In this manner, the fault diagnostic module 204 determines whether the detected fault is an open circuit fault or a short to voltage fault based on the behavior of the analog voltage input 320 upon transitioning the switches 324 and 328 from the first position P1 (corresponding to a normal operating state) to the second position P2 (corresponding to a fault diagnosis state).

Further, although FIG. 4 as shown corresponds to a pull-up configuration, similar operational principles correspond to a pull-down configuration. For example, in a pull-down configuration, the analog voltage input 320 being in the third range 412 during normal operation corresponds to a short to voltage fault. Conversely, the analog voltage input 320 being in the fourth range 416 corresponds to either one of an open circuit fault or a short to ground fault. Accordingly, the fault diagnostic module 204 transitions to the fault diagnosis state in response to the analog voltage input 320 being in the fourth range 416. If the analog voltage input 320 remains in the fourth range 416, then the detected fault corresponds to a short to ground fault. If the analog input voltage 320 is greater than the fourth range 416, then the detected fault corresponds to an open circuit fault.

Referring now to FIG. 5, a flexible input module 500 and switch module 504 are shown in a second example configuration. The switch module 504 includes a first resistor 508 a second resistor 512, and a third resistor 514 connected in series. A switch 516 is connected in parallel with the first resistor 508. When the switch 516 is open, a resistance of the switch module 504 corresponds to a combined resistance of the resistors 508, 512, and 514. Conversely, when the switch 516 is closed, the first resistor 508 is bypassed and the resistance of the switch module 504 corresponds to a resistance of the second resistor 512 and the third resistor 514. Accordingly, a voltage measured at an analog voltage input 520 of the input module 500 (e.g., corresponding to the voltage signal as described in FIG. 2) indicates whether the switch 516 is open or closed.

The input module 500 includes first and second switches 524 and 528, first and second current sources 532 and 536, and an optional capacitor 540. A supply voltage 544 (e.g., 5V) is provided to the first current source 532, and the second current source 536 is connected to ground. The supply voltage 544 is also provided to the third resistor 514. As shown, the first current source 532 and the second current source 536 are shown in a pull-up configuration. Although the pull-up configuration is shown, the first current source 532 and the second current source 536 may be arranged in a pull-down configuration. For example only, a current through the first current source 532 is approximately 7.5 µA to 1.25 µA. Accordingly, a current through the first current source 532 in the second configuration is significantly less than a current through the first current source 332 in the first configuration as shown in FIG. 3. The first current source 532 and the second current source 536 may be adjustable.

During normal operation, the first and second switches 524 and 528 are in a first position P1 ("up," as shown), connecting the analog voltage input 520 to the first current source 532 and an input 548 of the switch module 504. The fault diagnostic module 504 monitors the analog voltage input 520 during normal operation to determine whether the switch 516 is open or closed, and to determine whether a fault condition exists in the switch module 504.

For example, as shown in an analog voltage input graph 600 in FIG. 6, the analog voltage input 520 may be in a first range 604 (for example only, optimally 1.76V, or between 1.65.V and 1.88V) when the switch 516 is closed. The analog voltage input 520 may be in a second range 608 (for example only, optimally 4.27V, or between 4.15V and 4.39V) when the switch 316 is open. For the pull-up configuration shown in FIG. 5, the analog voltage input 520 may be in a third range 612 (for example only, between 4.39V and the supply voltage 544) corresponding to a high dead band range when a fault condition such as an open circuit or a short to voltage is present in the switch module 504. Conversely, the analog voltage input 520 may be in a fourth range 616 (for example only, between 0 and 1.65V) corresponding to a low dead band range when a fault condition such as a short to ground is present in the switch module 504. A fifth range 620 may correspond to an invalid switch state. Those skilled in the art can appreciate that the specific values shown in FIG. 6 are presented for example only, and my vary based on resistances of the resistors 508, 512, and 514, resistances of the current sources 532 and 536, manufacturing tolerances, etc.

Accordingly, for the pull-up configuration shown in FIG. 5, the analog voltage input 520 being in the fourth range 612 may indicate either one of an open circuit fault or a short to voltage fault. In response to the analog voltage input 520 being in the fourth range 612, the fault diagnostic module 204 transitions the switches 524 and 528 to a second position P2 ("down," as shown), connecting the analog voltage input 520 to the second current source 536 and the input 548 of the switch module 504, corresponding to a fault diagnosis state.

In response to the transition to the fault diagnosis state, the analog voltage input 520 indicates whether the detected fault is an open circuit fault or a short to voltage fault. For example, if the detected fault is an open circuit fault, the analog voltage input 520 changes to the fourth range 616 since the input 548 is disconnected from the supply voltage 544. Conversely, if the detected fault is a short to voltage fault, the analog voltage input 520 will be greater than the fourth range 616. In this manner, the fault diagnostic module 204 determines whether the detected fault is an open circuit fault or a short to voltage fault based on the behavior of the analog voltage input 520 upon transitioning the switches 524 and 528 from the first position P1 (corresponding to a normal operating state) to the second position P2 (corresponding to a fault diagnosis state).

Further, although FIG. 6 as shown corresponds to a pull-up configuration, similar operational principles correspond to a pull-down configuration. For example, in a pull-down configuration, the analog voltage input 520 being in the third range 612 during normal operation corresponds to a short to voltage fault. Conversely, the analog voltage input 520 being in the fourth range 616 corresponds to either one of an open circuit fault or a short to ground fault. Accordingly, the fault diagnostic module 204 transitions to the fault diagnosis state in response to the analog voltage input 520 being in the fourth range 616. If the analog voltage input 520 remains in the fourth range 616, then the detected fault corresponds to a short to ground fault. If the analog input voltage 520 is greater than the fourth range 616, then the detected fault corresponds to an open circuit fault.

Figure 7:
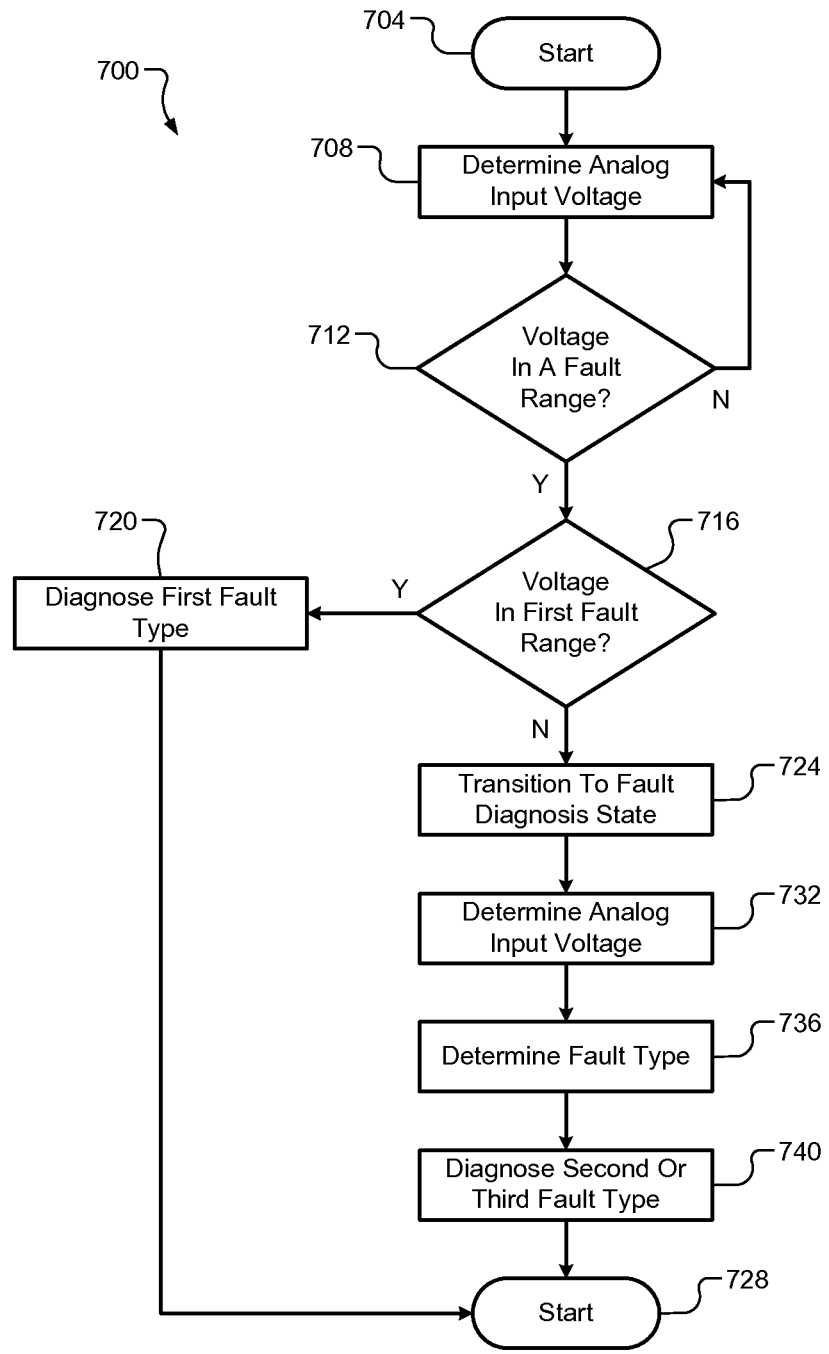
FIG. 7 is an example fault diagnostic method according to the present disclosure.

Referring now to FIG. 7, an example fault diagnostic method 700 begins at 704. At 708, the method 700 determines an analog input voltage. At 712, the method 700 determines whether the analog input voltage is in a fault range. If true, the method 700 continues to 716. If false, the method 700 determines that the analog input voltage is in a normal operating range and continues to 708.

At 716, the method 700 determines if the analog input voltage is in a first fault range indicating only a single type of fault (e.g., a first fault type, such as a short to ground). If true, the method 700 continues to 720. If false, the method 700 continues to 724. At 720, the method 700 diagnoses the fault as the first fault type and may generate and/or store an indication that the first fault type was detected. The method 700 then ends at 728.

At 724, the method 700 transitions from a normal operating state to a fault diagnosis state. At 732, the method 700 determines the analog input voltage (e.g., after waiting a predetermined amount of time). At 736, the method 700 determines whether the detected fault is a second fault type (e.g., a short to voltage) or a third fault type (e.g., an open circuit) based on the analog input voltage in the fault diagnosis state. At 740, the method 700 diagnoses the fault as the detected one of the second fault type and the third fault type and may generate and/or store an indication that the second fault type or the third fault type was detected. The method 700 then ends at 728.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:
1. A control module, comprising:
an input module configured to operate in a normal operating state and a fault diagnosis state, wherein the input module receives an input signal from a circuit module and generates a voltage based on the input signal, wherein the input module includes
a first current source that is connected between the input signal and an analog voltage input, via first and second switches actuated to a first position, in the normal operating state and is disconnected from the input signal in the fault diagnosis state, and a second current source that is connected between the input signal and the analog voltage input, via the first and second switches actuated to a second position, in the fault diagnosis state and is disconnected from the input signal in the normal operating state; and a fault diagnostic module that determines whether the voltage is in a first range or a second range while the input module is in the normal operating state, wherein the first range and the second range indicate that a fault is detected in the circuit module, that determines that the detected fault is a first fault type if the voltage is in the first range, that transitions the input module, by actuating the first and second switches from the first position to the second position, from the normal operating state to the fault diagnosis state if the voltage is in the second range, and that determines whether the detected fault is a second fault type or a third fault type based on the voltage while the input module is in the fault diagnosis state.

2. The control module of claim 1, wherein the first fault type, the second fault type, and the third fault type include a short to ground, a short to voltage, and an open circuit.

3. The control module of claim 1, wherein the fault diagnostic module determines whether the detected fault is the second fault type or the third fault type based on whether transitioning the input module to the fault diagnosis state causes the voltage to move from the second range to a third range.

4. The control module of claim 1, wherein the first current source is in a pull-up configuration and the second current source is in a pull-down configuration.

5. The control module of claim 1, wherein the first current source is in a pull-down configuration and the second current source is in a pull-up configuration.

6. A system comprising the control module of claim 1 and further comprising the circuit module, wherein the circuit module includes:
a first resistor;
a second resistor; and
a third switch,
wherein the first resistor and the second resistor are connected in series, the third switch is connected in parallel with the first resistor, and the first resistor is connected to the input signal.

7. A system comprising the control module of claim 1 and further comprising the circuit module, wherein the circuit module includes:
a first resistor;
a second resistor;
a third resistor; and
a third switch,
wherein the first resistor, the second resistor, and the third resistor are connected in series, the third switch is connected in parallel with the first resistor, the first resistor is connected to the input signal, and the third resistor is connected to a supply voltage of the input module.

8. A method for diagnosing electrical faults in a circuit, the method comprising:
receiving, at an input module configured to operate in a normal operating state and a fault diagnosis state, an input signal from a circuit module;
connecting the input signal to an analog voltage input, via a first current source and first and second switches actuated to a first position, in the normal operating state and disconnecting the input signal from the analog voltage input in the fault diagnosis state;
connecting the input signal to the analog voltage input, via a second current source and the first and second switches actuated to a second position, in the fault diagnosis state and disconnecting the input signal from the analog voltage input in the normal operating state;
generating a voltage based on the input signal;
determining whether the voltage is in a first range or a second range while the input module is in the normal operating state, wherein the first range and the second range indicate that a fault is detected in the circuit module;
determining that the detected fault is a first fault type if the voltage is in the first range;
transitioning the input module, by actuating the first and second switches from the first position to the second position, from the normal operating state to the fault diagnosis state if the voltage is in the second range; and
determining whether the detected fault is a second fault type or a third fault type based on the voltage while the input module is in the fault diagnosis state.

9. The method of claim 8, wherein the first fault type, the second fault type, and the third fault type include a short to ground, a short to voltage, and an open circuit.

10. The method of claim 8, further comprising determining whether the detected fault is the second fault type or the third fault type based on whether transitioning the input module to the fault diagnosis state causes the voltage to move from the second range to a third range.

11. The method of claim 8, wherein the first current source is in a pull-up configuration and the second current source is in a pull-down configuration.

12. The method of claim 8, wherein the first current source is in a pull-down configuration and the second current source is in a pull-up configuration.

* * * * *